(12) United States Patent
Jeon et al.

(10) Patent No.: US 12,456,717 B2
(45) Date of Patent: Oct. 28, 2025

(54) DISPLAY DEVICE

(71) Applicant: Samsung Display Co., LTD., Yongin-si (KR)

(72) Inventors: Hyung Il Jeon, Yongin-si (KR); Byung Choon Yang, Yongin-si (KR); Tae Hee Lee, Yongin-si (KR); Joo Woan Cho, Yongin-si (KR); Byeong Hwa Choi, Yongin-si (KR); Jin Woo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 432 days.

(21) Appl. No.: 17/731,821

(22) Filed: Apr. 28, 2022

(65) Prior Publication Data

US 2022/0352134 A1 Nov. 3, 2022

(30) Foreign Application Priority Data

Apr. 29, 2021 (KR) .......................... 10-2021-0056002

(51) Int. Cl.
  *H01L 25/16* (2023.01)
  *H01L 23/00* (2006.01)
  (Continued)

(52) U.S. Cl.
  CPC ............ *H01L 25/167* (2013.01); *H01L 24/05* (2013.01); *H10D 86/441* (2025.01); *H10D 86/60* (2025.01);
  (Continued)

(58) Field of Classification Search
  CPC ..... H01L 25/167; H01L 24/05; H01L 27/124; H01L 33/40; H01L 33/24; H01L 33/32;
  (Continued)

(56) References Cited

U.S. PATENT DOCUMENTS

| 7,893,438 B2 | 2/2011 | Kim et al. |
| 8,987,765 B2 | 3/2015 | Bibl et al. |

(Continued)

FOREIGN PATENT DOCUMENTS

| JP | 6104099 | 3/2017 |
| KR | 10-0543009 | 1/2006 |

(Continued)

*Primary Examiner* — Herve-Louis Y Assouman
(74) *Attorney, Agent, or Firm* — CANTOR COLBURN LLP

(57) ABSTRACT

A display device includes a base layer; a pixel circuit layer disposed on the base layer, the pixel circuit layer including a first transistor; and an insulating layer overlapping the first transistor; a first electrode disposed on the pixel circuit layer, the first electrode electrically connected to the first transistor via a contact hole of the insulating layer; a cover layer disposed on the first electrode, the cover layer overlapping at least a portion of the first electrode; a light emitting element including a first end and a second end electrically connected to the first electrode; a second electrode disposed on the light emitting element, the second electrode electrically connected to the second end of the light emitting element; and a third electrode disposed on the cover layer, the third electrode electrically contacting at least a portion of the first electrode.

8 Claims, 16 Drawing Sheets

(51) Int. Cl.
  *H01L 25/075*    (2006.01)
  *H10D 86/40*    (2025.01)
  *H10D 86/60*    (2025.01)
  *H10H 20/821*   (2025.01)
  *H10H 20/825*   (2025.01)
  *H10H 20/83*    (2025.01)
  *H10H 20/832*   (2025.01)
  *H10H 20/857*   (2025.01)
  *H10H 29/14*    (2025.01)
  *H10K 59/121*   (2023.01)
  *H10K 59/122*   (2023.01)
  *H10K 59/131*   (2023.01)

(52) U.S. Cl.
  CPC .. *H10H 20/832* (2025.01); *H01L 2224/05013* (2013.01); *H01L 2224/05016* (2013.01); *H01L 2224/05082* (2013.01); *H01L 2224/05123* (2013.01); *H01L 2224/05124* (2013.01); *H01L 2224/05155* (2013.01); *H01L 2224/05163* (2013.01); *H01L 2224/05164* (2013.01); *H01L 2224/05166* (2013.01); *H01L 2224/05169* (2013.01); *H01L 2224/05171* (2013.01); *H01L 2224/05178* (2013.01); *H01L 2224/0518* (2013.01); *H01L 2224/0519* (2013.01); *H01L 2224/05553* (2013.01); *H01L 2224/05561* (2013.01); *H01L 2224/05611* (2013.01); *H01L 2224/05639* (2013.01); *H01L 2224/05644* (2013.01); *H01L 2224/05647* (2013.01); *H01L 2924/0106* (2013.01); *H01L 2924/0133* (2013.01); *H01L 2924/0549* (2013.01); *H01L 2924/0635* (2013.01); *H01L 2924/066* (2013.01); *H01L 2924/0665* (2013.01); *H01L 2924/0695* (2013.01); *H01L 2924/07025* (2013.01); *H10H 20/821* (2025.01); *H10H 20/825* (2025.01)

(58) Field of Classification Search
  CPC . H01L 2224/05013; H01L 2224/05016; H01L 2224/05082; H01L 2224/05123; H01L 2224/05124; H01L 2224/05155; H01L 2224/05163; H01L 2224/05164; H01L 2224/05166; H01L 2224/05169; H01L 2224/05171; H01L 2224/05178; H01L 2224/0518; H01L 2224/0519; H01L 2224/05553; H01L 2224/05561; H01L 2224/05611; H01L 2224/05639; H01L 2224/05644; H01L 2224/05647; H01L 2924/0106; H01L 2924/0133; H01L 2924/0549; H01L 2924/0635; H01L 2924/066; H01L 2924/0665; H01L 2924/0695; H01L 2924/07025; H01L 25/0753; H01L 33/62; H01L 27/156; H01L 33/36; H10K 59/121; H10K 59/122; H10K 59/131

See application file for complete search history.

(56) References Cited

U.S. PATENT DOCUMENTS

| | | | |
|---|---|---|---|
| 9,029,880 | B2 | 5/2015 | Sakariya et al. |
| 9,147,717 | B2 | 9/2015 | Furuie et al. |
| 10,069,098 | B2 | 9/2018 | Kim et al. |
| 11,848,330 | B2 | 12/2023 | Kim et al. |
| 2006/0214168 | A1* | 9/2006 | Akimoto ............... H10K 50/816 257/E27.111 |
| 2006/0243989 | A1* | 11/2006 | Yamazaki ............ H10K 50/844 257/79 |
| 2011/0111540 | A1* | 5/2011 | Shin ...................... H10K 59/123 257/E51.018 |
| 2019/0326330 | A1* | 10/2019 | Xia ....................... H01L 25/0753 |
| 2022/0199725 | A1 | 6/2022 | Choi et al. |

FOREIGN PATENT DOCUMENTS

| | | |
|---|---|---|
| KR | 10-2018-0002471 | 1/2018 |
| KR | 1020210041150 A | 4/2021 |
| KR | 10-2022-0087669 | 6/2022 |

* cited by examiner

FIG. 9A
FIG. 9B
FIG. 9C
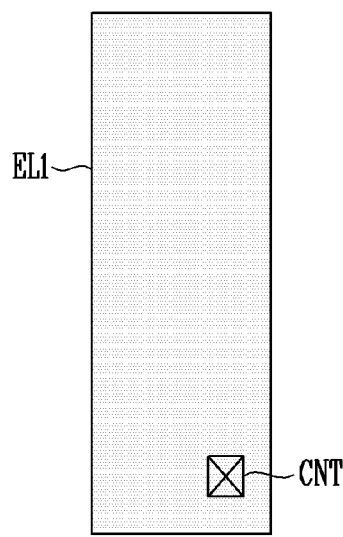
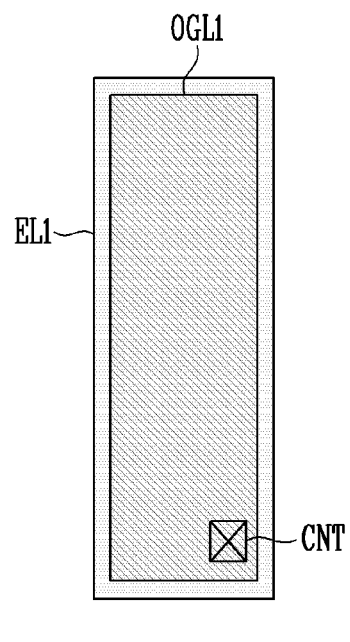
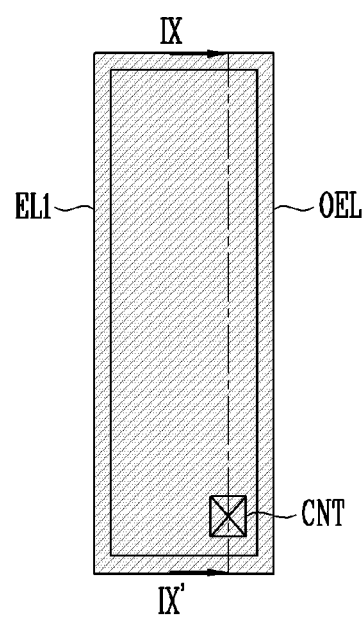

170: 170a, 170b

DISPLAY DEVICE

CROSS-REFERENCE TO RELATED APPLICATION(S)

This application claims priority to and benefits of Korean Patent Application No. 10-2021-0056002 under 35 U.S.C. § 119 filed on Apr. 29, 2021 in the Korean Intellectual Property Office, the entire contents of which are incorporated herein by reference.

BACKGROUND

1. Technical Field

Various embodiments relate to a display device.

2. Description of the Related Art

With an increase in interest in an information display and an increase in demand to use portable information media, demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a display device capable of preventing contact failure between a light emitting element and an anode and/or cathode, which may occur in a pixel contact hole region.

An embodiment may include a display device including a base layer; a pixel circuit layer disposed on the base layer, the pixel circuit layer including a first transistor; and an insulating layer overlapping the first transistor; a first electrode disposed on the pixel circuit layer, the first electrode electrically connected to the first transistor via a contact hole of the insulating layer; a cover layer disposed on the first electrode, the cover layer overlapping at least a portion of the first electrode; a light emitting element including a first end and a second end electrically connected to the first electrode; a second electrode disposed on the light emitting element, the second electrode electrically connected to the second end of the light emitting element; and a third electrode disposed on the cover layer, the third electrode electrically contacting at least a portion of the first electrode.

In an embodiment, an upper surface of the third electrode may be substantially flat.

In an embodiment, the first end of the light emitting element may be disposed on the third electrode, and the first end of the light emitting element may directly contact the third electrode.

In an embodiment, the third electrode may directly contact the first electrode, and the third electrode and the first electrode have a same potential.

In an embodiment, the first electrode may include a transparent conductive material.

In an embodiment, the third electrode may include a metal or at least one of copper, gold, tin, and an alloy thereof.

In an embodiment, the third electrode may electrically connect the first electrode and the first end of the light emitting element.

In an embodiment, the light emitting element may include a first semiconductor layer; an active layer disposed on a first surface of the first semiconductor layer; and a second semiconductor layer disposed on a first surface of the active layer.

In an embodiment, the first end of the light emitting element disposed on the contact hole of the insulating layer may directly contact the third electrode.

An embodiment may include a display device including a base layer; a pixel circuit layer disposed on the base layer, the pixel circuit layer including a first transistor; and an insulating layer overlapping the first transistor; a first electrode disposed on the pixel circuit layer, the first electrode electrically connected to the first transistor via a contact hole of the insulating layer; a cover layer disposed on the first electrode, the cover layer overlapping at least a portion of the first electrode; a light emitting element including a first end and a second end electrically connected to the first electrode; a second electrode disposed on the light emitting element, the second electrode electrically connected to the second end of the light emitting element; and a third electrode disposed on the cover layer, the third electrode electrically contacting at least a portion of the first electrode, wherein the cover layer may be disposed only in the contact hole of the insulating layer.

In an embodiment, an upper surface of the first electrode and an upper surface of the cover layer may be colinear.

In an embodiment, an upper surface of the third electrode may be substantially flat.

In an embodiment, the first end of the light emitting element may directly contact the third electrode.

In an embodiment, the third electrode may directly contact the first electrode, and the third electrode and the first electrode may have a same potential.

In an embodiment, the first electrode may include a transparent conductive material.

In an embodiment, the third electrode may include a metal or at least one of copper, gold, tin, and an alloy thereof.

In an embodiment, the first end of the light emitting element may be disposed on the third electrode, and the third electrode may electrically connect the first electrode and the first end of the light emitting element.

In an embodiment, the first end of the light emitting element disposed on the contact hole may directly contact the third electrode.

In an embodiment, the light emitting element may include a first semiconductor layer; an active layer disposed on a first surface of the first semiconductor layer; and a second semiconductor layer disposed on a first surface of the active layer.

In an embodiment, the light emitting element may be disposed between the third electrode and the second electrode with a height direction of the light emitting device intersecting the third electrode and the second electrode.

BRIEF DESCRIPTION OF THE DRAWINGS

The above and other aspects and features of the disclosure will become more apparent by describing in detail embodiments thereof with reference to the attached drawings, in which:

FIGS. 9A, 9B and 9C are schematic plan views schematically illustrating components of a pixel included in the display device in accordance with an embodiment.

DETAILED DESCRIPTION OF THE EMBODIMENTS

Figure 1:
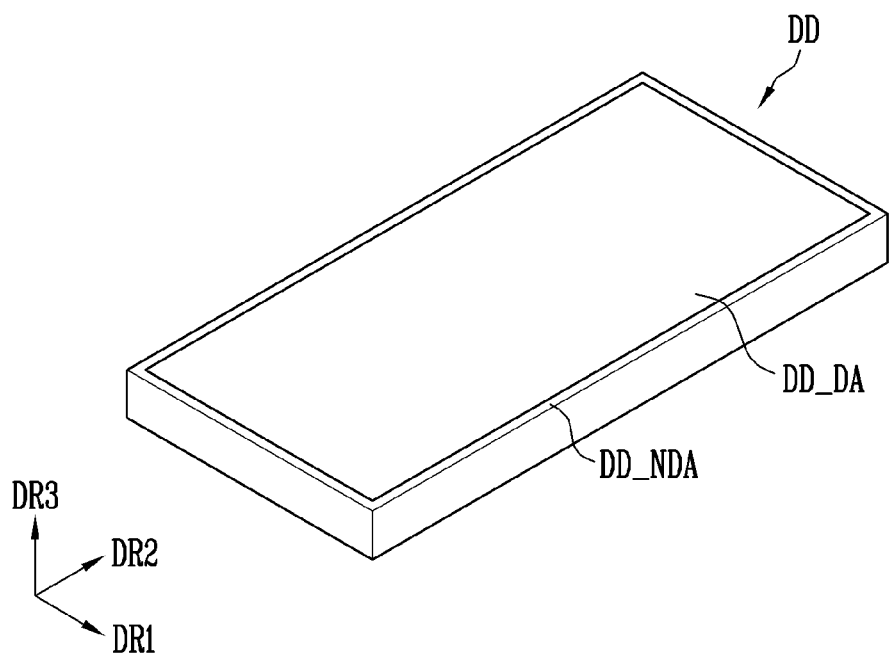
FIG. 1 is a schematic perspective view schematically illustrating a display device in accordance with an embodiment.

As the disclosure allows for various changes and numerous embodiments, embodiments will be illustrated in the drawings and described in detail in the written description. However, this is not intended to limit the disclosure to modes of practice, and it is to be appreciated that all changes, equivalents, and substitutes within the spirit and scope of the disclosure are understood as encompassed in the disclosure.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be further understood that the terms "comprise", "include", "have", and variations thereof when used in this specification, specify the presence of stated features, integers, steps, operations, elements, components, and/or combinations of them but do not preclude the presence or addition of one or more other features, integers, steps, operations, elements, components, and/or combinations thereof.

Furthermore, when a first part such as a layer, a film, an area, or a plate is disposed on a second part, the first part may be not only directly on the second part but a third part or other parts may intervene between them. In addition, when it is expressed that a first part such as a layer, a film, an area, or a plate is formed or disposed on a second part, the surface of the second part on which the first part is formed or disposed is not limited to an upper surface of the second part but may include other surfaces such as a side surface or a lower surface of the second part. To the contrary, when a first part such as a layer, a film, an area, or a plate is under or below a second part, the first part may be not only directly under or below the second part but a third part or other parts may intervene between them.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device in accordance with an embodiment will be described with reference to the attached drawings.

Figure 2:
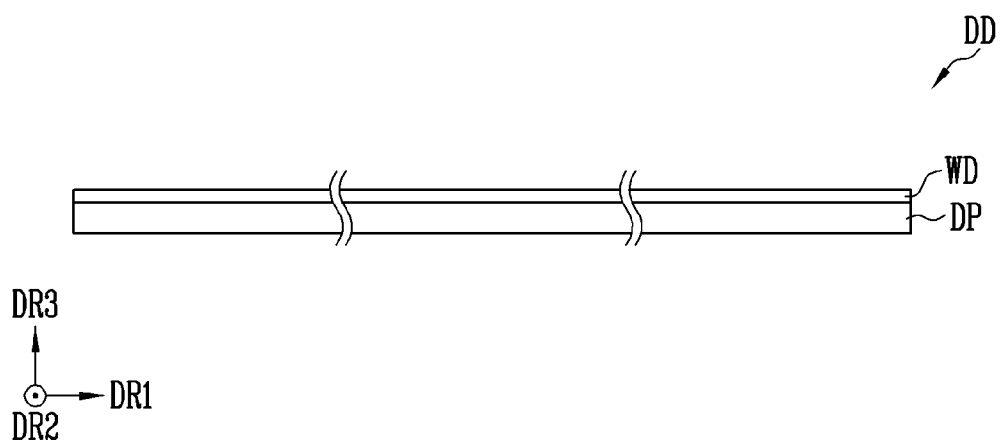
FIG. 2 is a schematic cross-sectional view schematically illustrating the display device of FIG. 1.
Figure 3:
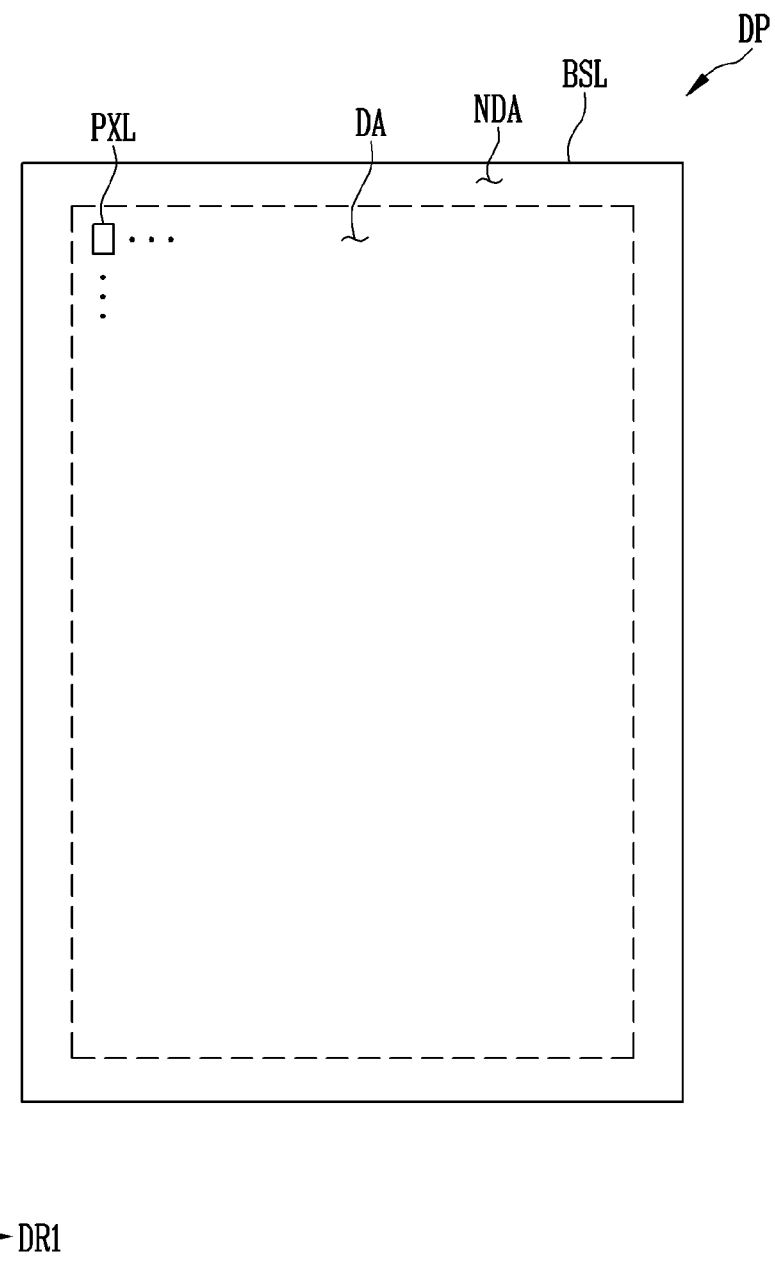
FIG. 3 is a schematic plan view schematically illustrating a display panel in accordance with an embodiment.
Figure 4:
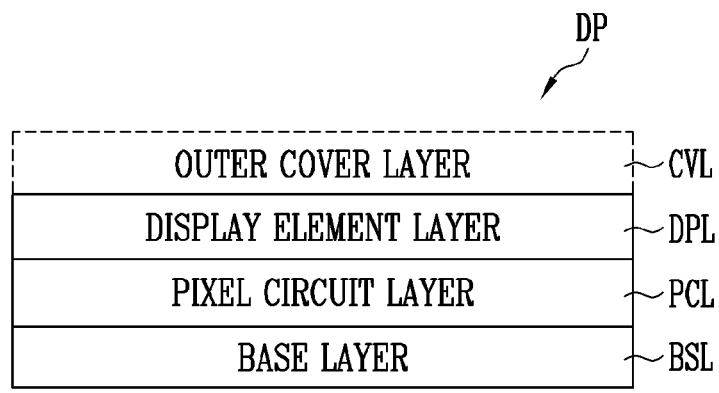
FIG. 4 is a schematic cross-sectional view schematically illustrating the display panel in accordance with an embodiment.

FIG. 1 is a schematic perspective view schematically illustrating a display device in accordance with an embodiment, FIG. 2 is a schematic-cross sectional view schematically illustrating the display device of FIG. 1, FIG. 3 is a schematic plan view schematically illustrating a display panel in accordance with an embodiment, and FIG. 4 is a schematic cross-sectional view schematically illustrating the display panel in accordance with an embodiment.

Referring to FIGS. 1 to 4, a display device DD may include a display panel DP and a window WD.

The display device DD may include a display region DD_DA that displays an image and a non-display region DD_NDA that does not display an image. The non-display region DD_NDA may be provided on at least one side or a side of the display region DD_DA and may be provided to enclose the display region DD_DA. In an embodiment, the shape of the display region DD_DA and the position of the non-display region DD_NDA may be relatively designed.

The display device DD may be provided in the shape of a substantially rectangular plate with substantially angled corners. However, according to an embodiment, the display device DD may be implemented in the shape of a substantially rectangular plate with substantially rounded corners. Further, the disclosure is not limited to this, and the display device DD may have various shapes.

The display device DD in accordance with an embodiment may be applied to an electronic device having on at least one surface or a surface thereof a display surface, such as a smart phone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or a wearable display device.

The display panel DP is a part that displays an image. The display panel DP may be implemented as a self-emissive display panel such as an organic light emitting display panel (OLED panel), a nano-scale LED display panel, or a quantum dot organic light emitting display panel (QD OLED panel). The display panel DP may be used as a non-emissive display panel such as a liquid crystal display panel (LCD panel), an electro-phoretic display panel (EPD panel), or an electro-wetting display panel (EWD panel). In case that implemented as the non-emissive display panel, the display device DD may further include a backlight unit that supplies light to the display panel DP.

The display panel DP may include a base layer BSL and pixels PXL disposed on the base layer BSL.

The base layer BSL may form a base member of the display device DD. In an embodiment, the base layer BSL may be a rigid or flexible substrate or film, and the material or properties thereof are not particularly limited. For example, the base layer BSL may be a rigid substrate made of glass or reinforced glass, a soft substrate (or a thin film) made of plastic or metal material, or at least one insulating film, and the material and/or properties thereof are not particularly limited.

The base layer BSL may include a display region DA on which an image is displayed, and a non-display region NDA excluding the display region DA. The non-display region NDA may be a region in which an image is not displayed, and may be a bezel region to enclose the display region DA.

The display region DA may be located or disposed on a surface of the display panel DP. For example, the display region DA may be located or disposed on a front surface of the display panel DP, and may be additionally located or disposed on side and rear surfaces of the display panel DP.

The non-display region NDA may be located or disposed around the display region DA to enclose the display region DA or may be adjacent to the display region DA. The non-display region NDA may include lines, pads, and a driving circuit connected or coupled to the pixels PXL of the display region DA.

Although only a pixel PXL is shown in FIG. 3, the pixels PXL may be substantially distributed and disposed in the display region DA. In an embodiment, the pixels PXL may be arranged in a matrix or stripe arrangement structure in the display region DA. However, the disclosure is not limited thereto.

The display panel DP may include a pixel circuit layer PCL, a display element layer DPL, and an outer cover layer CVL that may be sequentially located or disposed on the base layer BSL.

The pixel circuit layer PCL may be located or disposed on the base layer BSL, and may include transistors and signal lines connected or coupled to the transistors. For example, each transistor may have a configuration in which a semiconductor pattern, a gate electrode, a source electrode, and a drain electrode may be sequentially stacked each other with an insulating layer interposed or disposed therebetween.

The display element layer DPL may be disposed on the pixel circuit layer PCL, and may include light emitting elements. For example, the light emitting element may be an organic light emitting diode, an inorganic light emitting element, or a light emitting element which emits light while changing the wavelength of light to be emitted using quantum dots.

The outer cover layer CVL may be located or disposed on the display element layer DPL. The outer cover layer CVL may be in the form of an encapsulation substrate or an encapsulation film formed of a multilayer film. In case that the outer cover layer CVL is in the form of the encapsulation film, it may have a configuration where an inorganic film, an organic film, and an inorganic film may be sequentially stacked each other. The outer cover layer CVL may prevent external air and moisture from penetrating into the display element layer DPL and the pixel circuit layer PCL.

In an embodiment, the outer cover layer CVL may be formed of heat- and/or photo-curable resin, so it may be coated on the base layer BSL in a liquid form and be cured through a curing process using heat and/or light. Here, the outer cover layer CVL may protect the light emitting element and reliably fix the light emitting element.

A window WD may be provided on the display panel DP to protect an exposure surface of the display panel DP. The window WD may protect the display panel DP from external impact, and provide an input surface and/or a display surface to a user. The window WD may be connected or coupled to the display panel DP using an optically transparent cohesive (or adhesive) member (not shown).

The window WD may have a multilayer structure including at least one selected from among a glass substrate, a plastic film, and a plastic substrate. The multilayer structure may be formed through a continuous process or an adhesion process using an adhesive layer. The window WD may entirely or partially have flexibility.

A touch sensor may be disposed between the display panel DP and the window WD. The touch sensor may be disposed on or directly disposed on an image display surface of the display panel DP to receive a touch input of the user.

Hereinafter, a pixel included in a display device or a display panel in accordance with an embodiment will be described with reference to FIG. 5.

Figure 5:
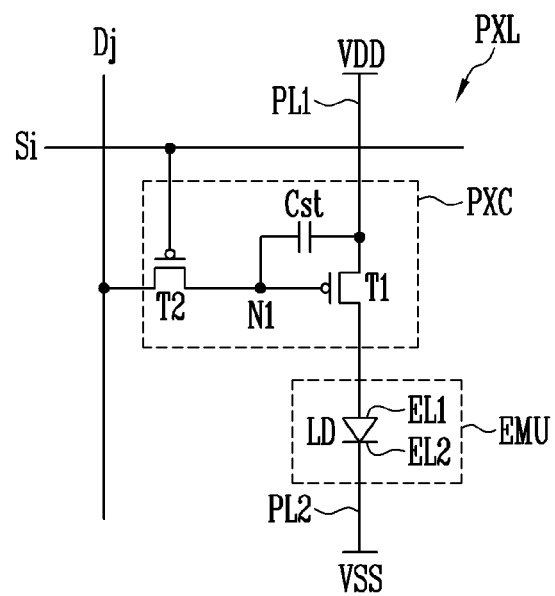
FIG. 5 is a schematic diagram of an equivalent circuit of a pixel illustrating an electrical connection relationship of a pixel included in the display device in accordance with an embodiment.

FIG. 5 is a schematic diagram of an equivalent circuit of a pixel illustrating an electrical connection relationship of a pixel included in the display device in accordance with an embodiment.

Referring to FIG. 5, the pixel PXL may include at least one emission unit EMU that generates light having luminance corresponding to a data signal. One pixel or a pixel PXL may further include a pixel circuit PXC to drive the emission unit EMU.

The emission unit EMU may include a light emitting element LD connected or coupled between a first power line PL1 to which the voltage of a first driving power supply VDD is applied and a second power line PL2 to which the voltage of a second driving power supply VSS is applied.

In detail, the emission unit EMU may include a first electrode EL1 connected or coupled to the first driving power supply VDD via the pixel circuit PXC and the first power line PL1, a second electrode EL2 connected or coupled to the second driving power supply VSS via the second power line PL2, and a light emitting element LD connected or coupled between the first electrode EL1 and the second electrode EL2. In an embodiment, the first electrode EL1 may be an anode, and the second electrode EL2 may be a cathode.

The light emitting element LD included in the emission unit EMU may include one end or an end (or a first end) connected or coupled to the first driving power supply VDD through the first electrode EL1, and the other end or another end (or a second end) connected or coupled to the second driving power supply VSS through the second electrode EL2.

The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first driving power supply VDD and the second driving power supply VSS may be set to a value equal to or greater than a threshold voltage of the light emitting element LD during an emission period of the pixel PXL.

The light emitting element LD of the emission unit EMU may emit light having luminance corresponding to driving current supplied thereto through the pixel circuit PXC. For example, during each frame period, the pixel circuit PXC may supply driving current corresponding to a gray scale value of one frame data to the emission unit EMU. The driving current supplied to the emission unit EMU may flow into the light emitting element LD.

Although one light emitting element LD is illustrated in FIG. 5, the disclosure is not limited thereto. In an embodiment, the emission unit EMU may include light emitting elements connected or coupled in parallel to each other in a same direction between the first electrode EL1 and the second electrode EL2, and may include a serial/parallel mixed structure in which the light emitting elements is connected or coupled to n serial stages.

The pixel circuit PXC may be connected or coupled to a scan line Si and a data line Dj of a pixel PXL. For example, if the pixel PXL is disposed on an i-th row (i is a natural number) and a j-th column (j is a natural number) of the display region DA (see FIG. 3), the pixel circuit PXC of the pixel PXL may be connected or coupled to an i-th scan line Si and a j-th data line Dj of the display region DA.

The pixel circuit PXC may include a first transistor T1, a second transistor T2, and a storage capacitor Cst.

The first terminal of the first transistor T1 (or the driving transistor) is connected to the first driving power supply VDD, and the second terminal thereof is electrically connected to the first electrode EL1 of the emission unit EMU. A gate electrode of the first transistor T1 is connected or coupled to a first node N1. Thus, the first transistor T1 may control the amount of driving current to be supplied to the light emitting element LD in response to the voltage of the first node N1.

A first terminal of the second transistor (or the switching transistor) T2 is connected to the data line Dj, and a second terminal thereof is connected to the first node N1. A gate electrode of the second transistor T2 may be connected or coupled to a scan line Si. In case that a scan signal having a turn-on voltage (a low level) is supplied from the scan line Si, the second transistor T2 is turned on to electrically connected or couple the first node N1 to the data line Dj. Here, if a data signal of one frame is supplied to the data line Dj, the data signal may be transmitted to the first node N1. The data signal transmitted to the first node N1 may be charged in the storage capacitor Cst.

One electrode or an electrode of the storage capacitor Cst may be connected or coupled to the first node N1, while the other electrode may be connected or coupled to the first terminal of the first transistor T1. The storage capacitor Cst may be charged with a voltage corresponding to a data signal supplied to the first node N1 and a voltage corresponding to a voltage difference of the first terminal of the first transistor T1, and may maintain the charged voltage until a data signal of a subsequent frame is supplied.

Although FIG. 5 illustrates an embodiment in which both the first transistor T1 and the second transistor T2 are P-type transistors, the disclosure is not limited thereto. In an embodiment, at least one of the first and second transistors T1 and T2 may be changed to an N-type transistor.

Further, the structure of the pixel circuit PXC of FIG. 5 may be changed in various ways. For example, the pixel circuit PXC may further include other circuit elements such as a transistor to compensate for the threshold voltage of the first transistor T1, a transistor to initialize the voltage of the first node N1, a transistor to control an emission time of the light emitting element LD, or a boosting capacitor for boosting the voltage of the first node N1.

Hereinafter, a light emitting element included in a display device and a pixel in accordance with an embodiment will be described with reference to FIGS. 6 and 7.

Figure 6:
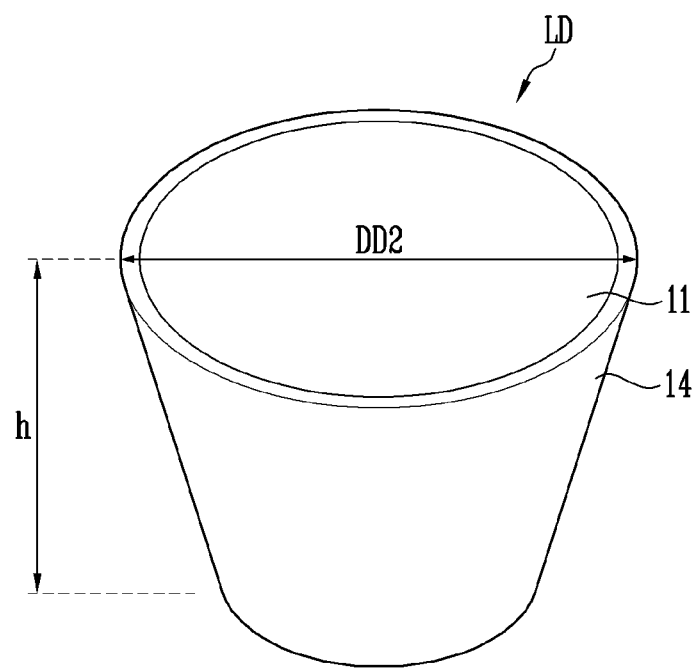
FIG. 6 is a schematic perspective view illustrating a light emitting element included in the display device in accordance with an embodiment.
Figure 7:
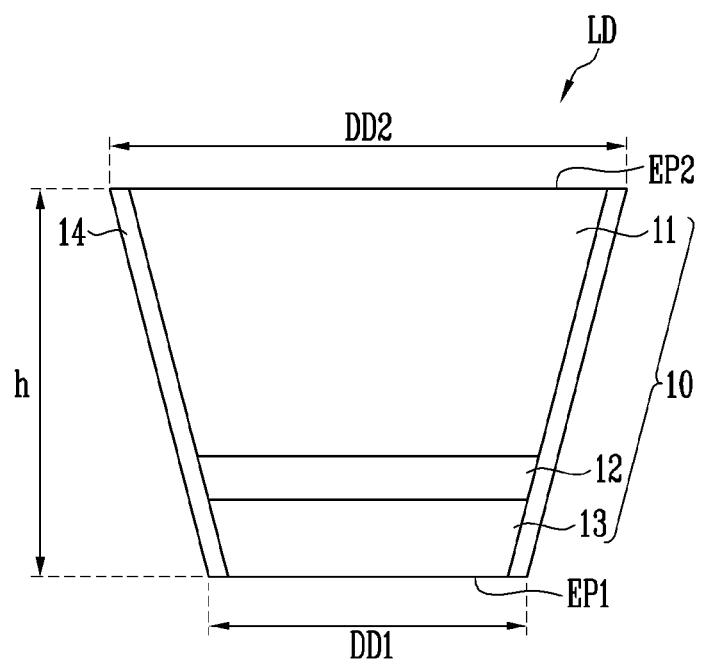
FIG. 7 is a schematic cross-sectional view illustrating the light emitting element included in the display device in accordance with an embodiment.

FIG. 6 is a perspective view illustrating a light emitting element included in the display device in accordance with an embodiment, and FIG. 7 is a sectional view illustrating the light emitting element included in the display device in accordance with an embodiment.

Referring to FIGS. 6 and 7, the light emitting element LD may include a first semiconductor layer 11, an active layer 12, and a second semiconductor layer 13. For example, the light emitting element LD may be an emissive stacked body 10 formed by successively stacking the first semiconductor layer 11, the active layer 12, and the second semiconductor layer 13. In an embodiment, the light emitting element LD may further include a coupling electrode layer, and the coupling electrode layer may be stacked each other on a surface of the first semiconductor layer 11 or a surface of the second semiconductor layer 13.

In the direction of the height h of the light emitting element LD, an upper surface may be referred to as a first end EP1, and a lower surface may be referred to as a second end EP2.

The light emitting element LD may have a substantially pillar shape in which a diameter DD1 of the first end EP1 and a diameter DD2 of the second end EP2 are different from each other. For example, the light emitting element LD may have a substantially pillar shape in which the diameter DD1 of the first end EP1 is smaller than the diameter DD2 of the second end EP2. For example, the light emitting element LD may have a substantially elliptical pillar shape whose diameter increases as it goes upward in the direction of the height h.

The disclosure is not limited thereto. In an embodiment, the light emitting element LD may have a substantially pillar shape in which the diameter DD1 of the first end EP1 is larger than the diameter DD2 of the second end EP2. In other words, according to an embodiment, the light emitting element LD may have a substantially elliptical pillar shape whose diameter decreases as it goes upward in the direction of the height h.

Further, in an embodiment, the light emitting element LD may be implemented such that the first end EP1 and the second end EP2 thereof may have the shape substantially of a polygon such as a rectangle, a square, a regular triangle, or a regular pentagon. In other words, according to an embodiment, the light emitting element LD may have a substantially truncated pyramid shape in which an area of an upper surface and an area of a lower surface are different from each other.

The light emitting element LD may have a size corresponding to a range from a nanometer scale to a micrometer scale. The size of the light emitting element LD is not limited thereto. The size of the light emitting element LD may be variously changed depending on design conditions of various devices (for example, a display device) using a light emitting device using the light emitting element LD as a light source.

The first semiconductor layer 11 may be a first conductive semiconductor layer. For example, the first semiconductor layer 11 may include at least one n-type semiconductor. For instance, the first semiconductor layer 11 may include an n-type semiconductor layer which may include any one semiconductor material of InAlGaN, GaN, AlGaN, InGaN, AlN, and InN and is doped with a first conductive dopant such as Si, Ge, or Sn. However, the material forming the first semiconductor layer 11 is not limited to this, and the first semiconductor layer 11 may be formed of various other materials.

The active layer 12 is disposed on one surface or a surface of the first semiconductor layer 11. The active layer 12 is disposed over the first semiconductor layer 11. The active layer 12 may be formed in a single or multi quantum well structure. In an embodiment, a cladding layer doped with a conductive dopant may be formed over and/or under or below the active layer 12. For example, the cladding layer may be formed of an AlGaN layer or an InAlGaN layer. In an embodiment, a material such as AlGaN or InAlGaN may be used to form the active layer 12, and various other materials may be used to form the active layer 12.

If a voltage equal to or greater than a threshold voltage is applied to the upper and lower surfaces of the light emitting element LD, the light emitting element LD emits light by coupling electron-hole pairs in the active layer 12. By controlling the light emission of the light emitting element LD using the foregoing principle, it may be used as the light source for various display devices including the pixel of the display device.

The second semiconductor layer 13 is disposed on one surface or a surface of the active layer 12. The second semiconductor layer 13 may be disposed over the active layer 12. The second semiconductor layer 13 may include a conductive semiconductor layer of a type different from that of the first semiconductor layer 11. For example, the second semiconductor layer 13 may include at least one p-type semiconductor layer. For instance, the second semiconductor layer 13 may include a p-type semiconductor layer which may include at least one semiconductor material of InAlGaN, GaN, AlGaN, InGaN, AlN, and InN, and is doped with a second conductive dopant such as Mg, Zn, Ca, Sr, or Ba. However, the material forming the second semiconductor layer 13 is not limited to this, and the second semiconductor layer 13 may be formed of various other materials.

It has been described that the first semiconductor layer 11 and the second semiconductor layer 13 each are composed of a single layer, but the disclosure is not limited thereto. In an embodiment, depending on the material of the active layer 12, each of the first semiconductor layer 11 and the second semiconductor layer 13 may further include at least one or more layers, for example, a cladding layer and/or a Tensile Strain Barrier Reducing (TSBR) layer. The TSBR layer may be a strain mitigating layer which is disposed between semiconductor layers having different lattice structures to serve as a buffer for reducing a difference in lattice constant. Although the TSBR layer may be formed of a p-type semiconductor layer such as p-GaInP, p-AlInP, or p-AlGaInP, the disclosure is not limited thereto.

In an embodiment, the light emitting element LD may further include an electrode disposed over the first semiconductor layer 11 and/or under or below the second semiconductor layer 13, in addition to the above-described first semiconductor layer 11, active layer 12, and second semiconductor layer 13.

The electrode may be an ohmic contact electrode, but the disclosure is not limited thereto. In an embodiment, the electrode may be a Schottky contact electrode. The electrode may include a conductive material. For example, the electrode may include opaque metal using chromium (Cr), titanium (Ti), aluminum (Al), gold (Au), nickel (Ni), and oxides or alloys thereof alone or in combination, but the disclosure is not limited thereto. In an embodiment, the electrode may include transparent conductive oxide such as indium tin oxide (ITO), indium zinc oxide (IZO), zinc oxide (ZnO), indium gallium zinc oxide (IGZO), or indium tin zinc oxide (ITZO). The electrode may be a part that is in contact with or direct contact with the anode or the cathode.

In an embodiment, the light emitting element LD may further include an insulating layer 14. According to an embodiment, the insulating layer 14 may be omitted, and be provided to cover or overlap only a portion of the emissive stacked body 10.

The insulating layer 14 may prevent the active layer 12 from short-circuiting due to contacting a conductive material except the first and second semiconductor layers 11 and 13. Furthermore, the insulating layer 14 may minimize surface defects of the light emitting element LD, thereby improving the lifespan and luminous efficiency of the light emitting element LD. In the case where the light emitting elements LD are disposed in close contact with each other, the insulating layer 14 may prevent an undesired short-circuit from occurring between the light emitting elements LD. Whether the insulating layer 14 is provided is not limited so long as the active layer 12 may be prevented from short-circuiting with external conductive material.

The light emitting element LD may further include a reflective member to enclose the outer circumference of the insulating layer 14. The reflective member may be made of a material having a reflectivity to focus the light emitted from the light emitting element LD to a specific region while travelling in the image display direction. For example, the reflective member may be formed of a conductive substance having a reflectivity.

Hereinafter, the structure of a display device in accordance with an embodiment will be described with reference to FIG. 8.

Figure 8:
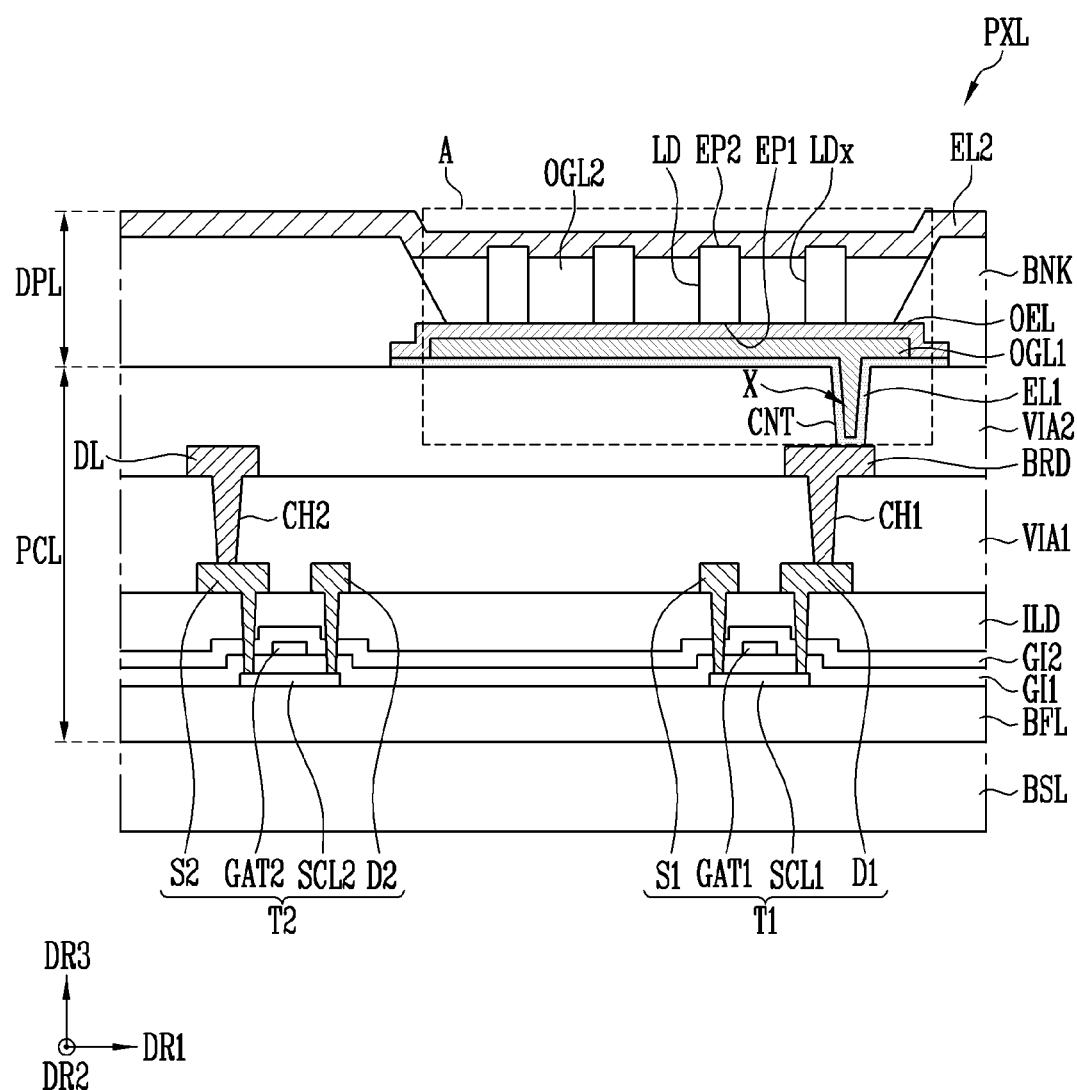
FIG. 8 is a schematic cross-sectional view illustrating a pixel included in the display device in accordance with an embodiment.

FIG. 8 is a sectional view illustrating a pixel included in the display device in accordance with an embodiment.

Referring to FIG. 8, a pixel PXL included in the display device in accordance with an embodiment may include a base layer BSL, a pixel circuit layer PCL, and a display element layer DPL.

The base layer BSL may be a rigid substrate or a flexible substrate. For example, in case that the base layer BSL is the rigid substrate, the base layer BSL may be implemented as a glass substrate, a quartz substrate, a glass ceramic substrate, a crystalline glass substrate, or the like within the spirit and the scope of the disclosure. In case that the base layer BSL is the flexible substrate, the base layer BSL may be implemented as a polymer organic substrate including polyimide, polyamide, or the like, a plastic substrate, or the like within the spirit and the scope of the disclosure.

The pixel circuit layer PCL may be located or disposed on the base layer BSL.

The pixel circuit layer PCL may include at least one transistor and lines connected or coupled thereto. Furthermore, the pixel circuit layer PCL may include a buffer layer BFL, a first gate insulating layer GI1, a second gate insulating layer GI2, an interlayer insulating layer ILD, a first via layer VIA1, and a second via layer VIA2 that may be sequentially stacked each other on one surface or a surface of the base layer BSL.

The buffer layer BFL may be located or disposed on the base layer BSL to cover or overlap the base layer BSL. The buffer layer BFL may prevent impurities from being diffused from an external device into the pixel circuit layer PCL. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). In an embodiment, the buffer layer BFL may be omitted. Further, a lower metal layer may be located or disposed between the base layer BSL and the buffer layer BFL.

The first transistor T1 may include a first semiconductor pattern SCL1, a first gate electrode GAT1, a first source electrode S1, and a first drain electrode D1.

The first semiconductor pattern SCL1 may be located or disposed on the buffer layer BFL. The first semiconductor pattern SCL1 may include a channel region and a source region and a drain region positioned on both sides of the channel region. The source region of the first semiconductor pattern SCL1 may be electrically connected or coupled to the first source electrode S1, and the drain region thereof may be electrically connected or coupled to the first drain electrode D1. In other words, the source region and the drain region may be extended to be electrically connected or coupled to electrodes of other layers through contact holes, respectively.

The second transistor T2 may include a second semiconductor pattern SCL2, a second gate electrode GAT2, a second source electrode S2, and a second drain electrode D2.

The second semiconductor pattern SCL2 may be located or disposed on the buffer layer BFL. The second semiconductor pattern SCL2 may include a channel region and a source region and a drain region positioned on both sides of the channel region. The source region of the second semiconductor pattern SCL2 may be electrically connected or coupled to the second source electrode S2, and the drain region thereof may be electrically connected or coupled to the second drain electrode D2. In other words, the source region and the drain region may be extended to be electrically connected or coupled to electrodes of other layers through contact holes, respectively.

The first semiconductor pattern SCL1 and the second semiconductor pattern SCL2 may include at least one of polysilicon, amorphous silicon, and an oxide semiconductor.

The first gate insulating layer GI1 is disposed on the first semiconductor pattern SCL1, the second semiconductor pattern SCL2, and the buffer layer BFL. The first gate insulating layer GI1 covers or overlaps the first semiconductor pattern SCL1, the second semiconductor pattern SCL2, and the buffer layer BFL.

The first gate insulating layer GI1 may include an inorganic material. For example, the first gate insulating layer GI1 may include at least one of silicon nitride ($SiN_x$), silicon oxide ($SiO_x$), silicon oxynitride ($SiO_xN_y$), and aluminum oxide ($AlO_x$). In an embodiment, the first gate insulating layer GI1 may include an organic material.

The first gate electrode GAT1 and the second gate electrode GAT2 may be located or disposed on the first gate insulating layer GI1. The first gate electrode GAT1 may be located to overlap the channel region of the first semiconductor pattern SCL1, and the second gate electrode GAT2 may be located or disposed to overlap the channel region of the second semiconductor pattern SCL2.

The second gate insulating layer GI2 may be located or disposed on the first gate electrode GAT1, the second gate electrode GAT2, and the first gate insulating layer GI1. The second gate insulating layer GI2 covers or overlaps the first gate electrode GAT1, the second gate electrode GAT2, and the first gate insulating layer GI1.

The second gate insulating layer GI2 may include the same material or a similar material as the first gate insulating layer GI1, and may include at least one of silicon nitride ($SiN_x$), silicon oxide ($SiO_x$), silicon oxynitride ($SiO_xN_y$), and aluminum oxide ($AlO_x$), for example.

The interlayer insulating layer ILD may be located or disposed on the second gate insulating layer GI2. The interlayer insulating layer ILD covers or overlaps the second gate insulating layer GI2. The interlayer insulating layer ILD may include the same material or similar material as the second gate insulating layer GI2, and may include an inorganic material or an organic material.

The first source electrode S1 and the first drain electrode D1 may be located or disposed on the interlayer insulating layer ILD. Here, the first source electrode S1 may have the same configuration as the first terminal of the first transistor T1 of FIG. 5, and the first drain electrode D1 may have the same configuration as the second terminal of the first transistor T1.

The first drain electrode D1 may be electrically connected or coupled to the first electrode EL1 of the display element layer DPL through a first contact hole CH1 of a first via layer VIA1, a bridge electrode BRD, and a pixel contact hole CNT of a second via layer VIA2, which will be described later. Thus, the first transistor T1 may transmit the voltage of the first driving power supply VDD (see FIG. 5) to the first electrode EL1. Here, the pixel contact hole CNT may be referred to as a contact hole.

In a pixel contact hole region X where the first transistor T1 and the first electrode EL1 of the display device in accordance with a comparative example are electrically connected or coupled, the surface of the first electrode EL1 may not be flat. In contrast, the display device in accordance with an embodiment may provide a flat electrode surface in the pixel contact hole region X by locating a first organic layer OGL1 and an overlapping electrode OEL on the first electrode EL1. Therefore, the light emitting element LD positioned in the pixel contact hole region X is disposed without being inclined, thus preventing contact failure between the light emitting element LD and the first electrode EL1 and/or the second electrode EL2, which may occur in the pixel contact hole region X.

The second source electrode S2 and the second drain electrode D2 may be located or disposed on the interlayer insulating layer ILD. Here, the second source electrode S2 may have the same configuration as the first terminal of the second transistor T2 of FIG. 5, and the second drain electrode D2 may have the same configuration as the second terminal of the second transistor T2.

The second source electrode S2 may be electrically connected or coupled to the data line DL through the second contact hole CH2 of the first via layer VIA1 that will be described later. Here, the data line DL may have the same configuration as the j-th data line Dj of FIG. 5.

The first via layer VIA1 may be located or disposed over the first source electrode S1, the first drain electrode D1, the second source electrode S2, the second drain electrode D2, and the interlayer insulating layer ILD. The first via layer VIA1 covers or overlaps the first source electrode S1, the first drain electrode D1, the second source electrode S2, the second drain electrode D2, and the interlayer insulating layer ILD.

The first via layer VIA1 may include at least one organic insulating layer. The first via layer VIA1 may be formed of a single-layer structure or a multilayer structure, and may include an inorganic insulating material or an organic insulating material. For example, the first via layer VIA1 may include at least one of polyacrylates resin, epoxy resin, phenolic resin, polyamides resin, and polyimides resin.

The first contact hole CH1 of the first via layer VIA1 may physically and/or electrically connect or couple the first drain electrode D1 and the bridge electrode BRD.

The second contact hole CH2 of the first via layer VIA1 may physically and/or electrically connect or couple the second source electrode S2 and the data line DL.

The bridge electrode BRD and the data line DL may be located or disposed on the first via layer VIA1.

The second via layer VIA2 may be located or disposed on the bridge electrode BRD, the data line DL, and the first via layer VIA1. The second via layer VIA2 covers or overlaps the bridge electrode BRD, the data line DL, and the first via layer VIA1 The second via layer VIA2 may be referred to as an insulating layer.

The pixel contact hole CNT of the second via layer VIA2 may physically and/or electrically connect or couple the bridge electrode BRD and the first electrode EL1.

The second via layer VIA2 may include the same material or similar material as the first via layer VIA1. For example, the second via layer VIA2 may include at least one of polyacrylates resin, epoxy resin, phenolic resin, polyamides resin, and polyimides resin.

The display element layer DPL may include a bank BNK, a first electrode EL1, a first organic layer OGL1, an overlapping electrode OEL, light emitting elements LD, a second organic layer OGL2, and a second electrode EL2.

The bank BNK may be located or disposed on the second via layer VIA2. The bank BNK may be a dam structure or a pixel defining layer that partitions an emission region in which the light emitting element LD is disposed and emits light. The bank BNK may include an inorganic insulating layer formed of inorganic material or an organic insulating layer formed of organic material.

The first electrode EL1 may be located or disposed on the second via layer VIA2. The first electrode EL1 may be located or disposed on the pixel circuit layer PCL.

The first electrode EL1 may be electrically connected or coupled to the first end EP1 of each light emitting element LD. The first electrode EL1 may be electrically connected or coupled to the first transistor T1 of the pixel circuit layer PCL through the pixel contact hole CNT in the pixel contact hole region X. Here, the first electrode EL1 may be an anode.

The first electrode EL1 may include transparent conductive material having a reflectivity. For example, the first electrode EL1 may include conductive oxide such as indium tin oxide (ITO), indium zinc oxide (IZO), zinc oxide (ZnO), indium gallium zinc oxide (IGZO), or indium tin zinc oxide (ITZO), and a conductive polymer such as PEDOT (poly(3,4-ethylenedioxythiophene)). Further, the first electrode EL1 may include opaque metal advantageous for reflecting the light emitted from the light emitting elements LD in the image display direction (for example, a third direction DR3) of the display device. For instance, the first electrode EL1 may further include metal such as magnesium (Mg), aluminum (Al), platinum (Pt), palladium (Pd), nickel (Ni), neodymium (Nd), iridium (Ir), chromium (Cr), titanium (Ti), molybdenum (Mo), and alloys thereof.

The first organic layer OGL1 may be located or disposed on the first electrode EL1. The first organic layer OGL1 may be located or disposed to overlap a portion of the first electrode EL1. In other words, the first organic layer OGL1 may cover or overlap at least a portion of the first electrode EL1. The first organic layer OGL1 may planarize a stepped structure due to components disposed in the pixel contact hole region X. For example, the first organic layer OGL1 may be provided so that the surface of the pixel contact hole region X is planarized in a portion where the first electrode EL1 is concavely disposed by the pixel contact hole CNT in the pixel contact hole region X. In an embodiment, the upper surface of the first electrode EL1 and the upper surface of the first organic layer OGL1 may be placed on a same line by the first organic layer OGL1 located or disposed over a portion of the first electrode EL1. Here, the first organic layer OGL1 may be referred to as a cover layer.

The first organic layer OGL1 may include an organic material. For example, the first organic layer OGL1 may include at least one of polyacrylates resin, epoxy resin, phenolic resin, polyamides resin, and polyimides resin. However, the disclosure is not limited thereto, but the first organic layer OGL1 may include an inorganic material.

The overlapping electrode OEL may be located or disposed on the first electrode EL1 and the first organic layer OGL1. The overlapping electrode OEL may be positioned to cover or overlap the first organic layer OGL1 and to cover or overlap at least a portion of the first electrode EL1. Here, the overlapping electrode OEL may be referred to as a third electrode.

The overlapping electrode OEL may be in contact with or direct contact with at least a portion of the first electrode EL1. Thus, the overlapping electrode OEL may have the same potential as the first electrode EL1.

The overlapping electrode OEL may be formed of a bonding electrode that may be bonded to the light emitting element LD. For example, the overlapping electrode OEL may include a metal such as copper (Cu), gold (Au), tin (Sn), or an alloy thereof. In other words, the overlapping electrode OEL may include SAC (Sn—Ag—Cu). Thus, the overlapping electrode OEL may electrically connect or couple the first end EP1 of the light emitting element LD and the first electrode EL1.

The upper surface of the overlapping electrode OEL may be flat.

The light emitting element LD may be located or disposed on the overlapping electrode OEL. The first end EP1 of the light emitting element LD may be positioned on the overlapping electrode OEL, and the first end EP1 of the light emitting element LD may be physically and/or electrically connected or coupled to the overlapping electrode OEL.

The first end EP1 of the light emitting element LD may be disposed to face the overlapping electrode OEL, and the second end EP2 of the light emitting element LD may be disposed to face the second electrode EL2.

The light emitting element LD may be disposed between the overlapping electrode OEL and the second electrode EL2 in the direction of the height h of the light emitting element LD. The light emitting element LD shown in FIG. 8 may correspond to the light emitting element LD of FIGS. 6 and 7 described above. FIG. 8 illustrates that the diameter of the first end EP1 is the same as the diameter of the second end EP2 to schematically illustrate the light emitting element LD.

The second organic layer OGL2 is positioned to cover or overlap the first electrode EL1 and the overlapping electrode OEL, and to cover or overlap at least a portion of the light emitting element LD. The second organic layer OGL2 may be positioned between two banks BNK in the first direction DR1.

The second organic layer OGL2 may be positioned between the light emitting elements LD to planarize a stepped structure between the light emitting elements LD. In other words, the second organic layer OGL2 may expose the second end EP2 of the light emitting element LD, and may planarize components disposed under or below the second electrode EL2 to dispose the second electrode EL2.

The second organic layer OGL2 may include an organic material. For example, the second organic layer OGL2 may include at least one of polyacrylates resin, epoxy resin, phenolic resin, polyamides resin, and polyimides resin. However, the disclosure is not limited thereto, but the second organic layer OGL2 may include an inorganic material.

The second electrode EL2 may be located or disposed over the second organic layer OGL2, the light emitting elements LD and LDx, and the bank BNK. The second electrode EL2 may be electrically connected or coupled to the second end EP2 of each of the light emitting elements LD and LDx. The second electrode EL2 may be a cathode.

The second electrode EL2 may include transparent conductive material having a reflectivity. For example, the second electrode EL2 may include conductive oxide such as indium tin oxide (ITO), indium zinc oxide (IZO), zinc oxide (ZnO), indium gallium zinc oxide (IGZO), or indium tin zinc oxide (ITZO), and a conductive polymer such as PEDOT (poly(3,4-ethylenedioxythiophene)). However, the material of the second electrode EL2 is not limited to the above description.

Hereinafter, components included in a display device in accordance with an embodiment will be described with reference to FIGS. 9A through 9C to 11.

Figure 10:
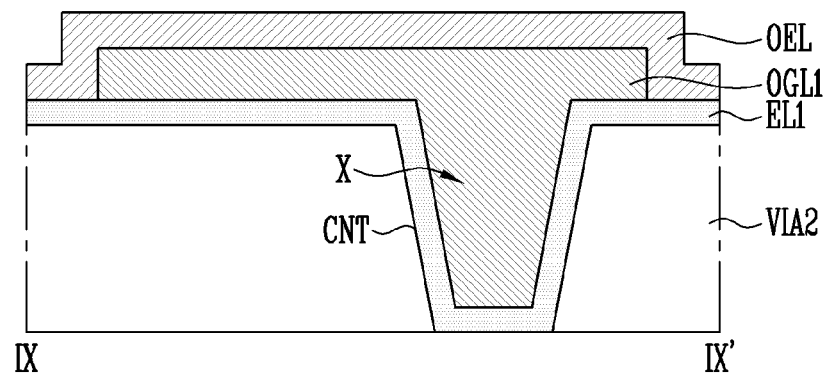
FIG. 10 is a schematic cross-sectional view taken along line IX-IX' of FIG. 9C.
Figure 11:
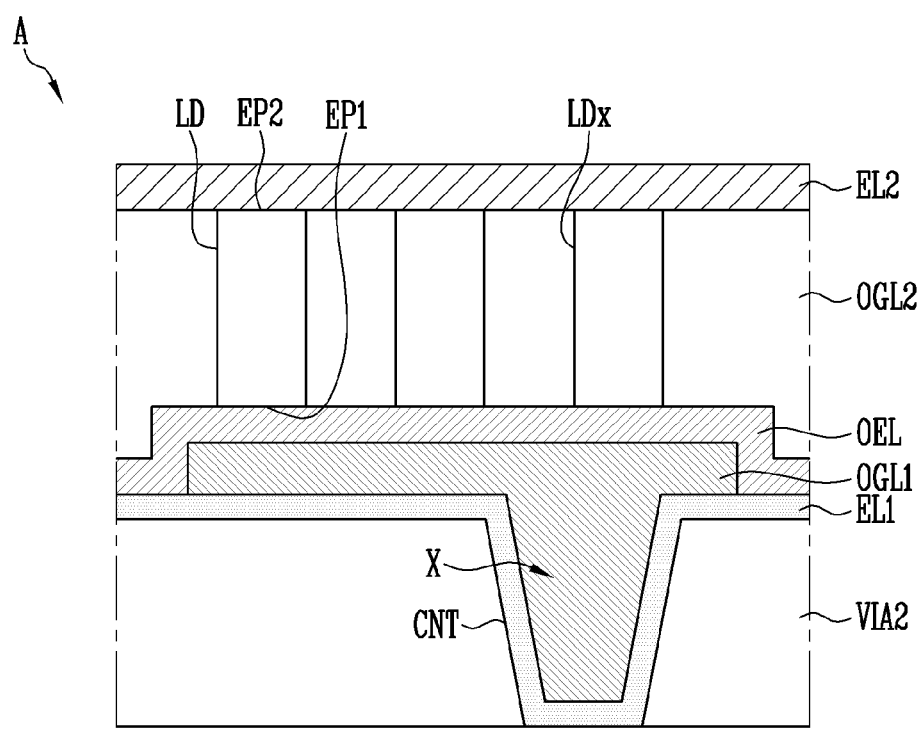
FIG. 11 is a schematic cross-sectional view illustrating a structure in which a light emitting element and a second electrode are disposed in the plan views of FIGS. 9A, 9B and 9C.

FIGS. 9A through 9C are schematic plan views schematically illustrating components of a pixel included in the display device in accordance with an embodiment, FIG. 10 is a schematic cross-sectional view taken along line IX-IX' of FIG. 9C, and FIG. 11 is a schematic cross-sectional view illustrating a structure in which a light emitting element and a second electrode are disposed in the schematic cross-sectional view of FIG. 10. FIGS. 9A through 9C to 11 will be described with reference to FIG. 8 described above.

Referring to FIGS. 9A through 9C to 11, the display element layer in accordance with an embodiment may include a first electrode EL1, a first organic layer OGL1, an overlapping electrode OEL, a light emitting element LD, a second organic layer OGL2, and a second electrode EL2.

FIG. 9A illustrates the first electrode EL1, and FIG. 9B illustrates the first electrode EL1 and the first organic layer OGL1 overlapping at least a portion of the first electrode EL1, and FIG. 9C illustrates the first electrode EL1, the first organic layer OGL1, and the overlapping electrode OEL that overlaps the first electrode EL1 and the first organic layer OGL1.

The first electrode EL1 may be electrically connected or coupled to the first transistor T1 through the pixel contact hole CNT.

The first organic layer OGL1 may be provided on the first electrode EL1 to be positioned within the first electrode EL1. Further, the first organic layer OGL1 may be provided on the first electrode EL1 to cover or overlap the pixel contact hole CNT. The first organic layer OGL1 may be provided on the first electrode EL1 to overlap most of the area of the first electrode EL1.

The overlapping electrode OEL may be provided on the first organic layer OGL1 to completely cover or overlap the first organic layer OGL1. The overlapping electrode OEL may be in contact with or direct contact with the first electrode EL1 in a portion where the first organic layer OGL1 and the first electrode EL1 do not overlap. In other words, the overlapping electrode OEL may be in contact with or direct contact with the first electrode EL1 at an edge portion surrounding the first organic layer OGL1, so the overlapping electrode OEL and the first electrode EL1 may have the same potential.

Further, the overlapping electrode OEL may be located or disposed on the first organic layer OGL1 to have a flat upper surface.

Referring to FIG. 11, the light emitting element LD may be located or disposed on the upper surface of the flat overlapping electrode OEL.

The first end EP1 of the light emitting element LD may be in contact with or direct contact with the upper surface of the overlapping electrode OEL, and may be physically and/or electrically connected or coupled to the overlapping electrode OEL.

The light emitting element LDx disposed in the pixel contact hole region X (for example, over the pixel contact hole CNT) may be disposed without being inclined by the flat overlapping electrode OEL. Thus, the display device in accordance with an embodiment may prevent contact failure between the light emitting element LDx and the first electrode EL1 and/or the second electrode EL2, which may occur in the pixel contact hole region X.

Since the description of the second organic layer OGL2 and the second electrode EL2 is the same as that described with reference to FIG. 8, it will be omitted.

Hereinafter, components included in a display device in accordance with an embodiment will be described with reference to FIGS. 12A through 12C to 14.

Figure 12A:
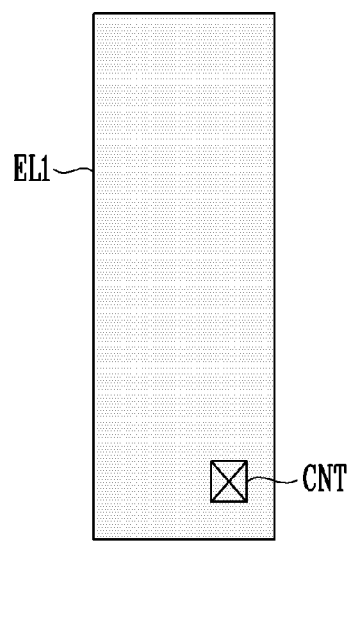
FIGS. 12A, 12B and 12C are schematic plan views schematically illustrating components of a pixel included in the display device in accordance with an embodiment.
Figure 12B:
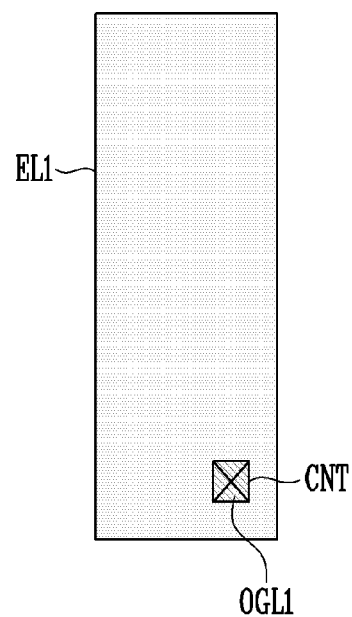
Figure 12C:
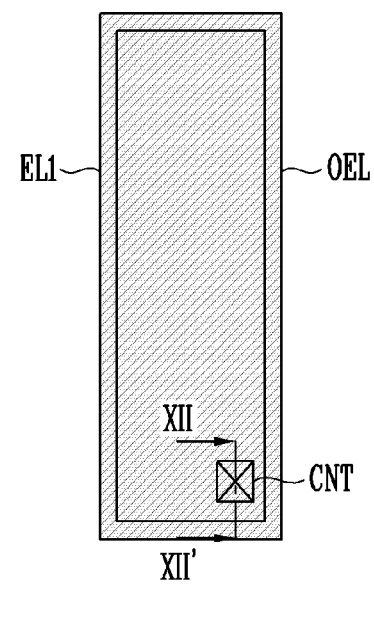
Figure 13:
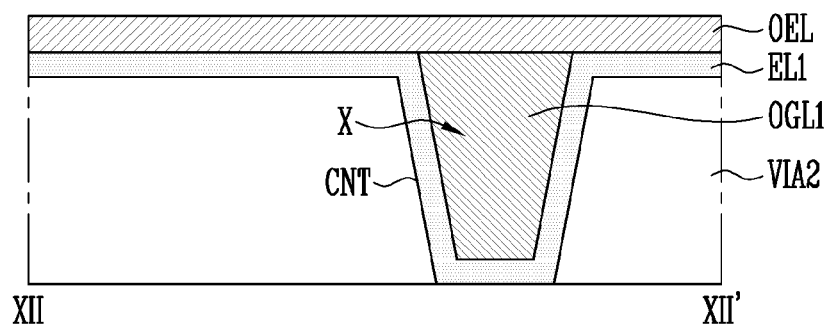
FIG. 13 is a schematic cross-sectional view taken along line XII-XII' of FIG. 12C.
Figure 14:
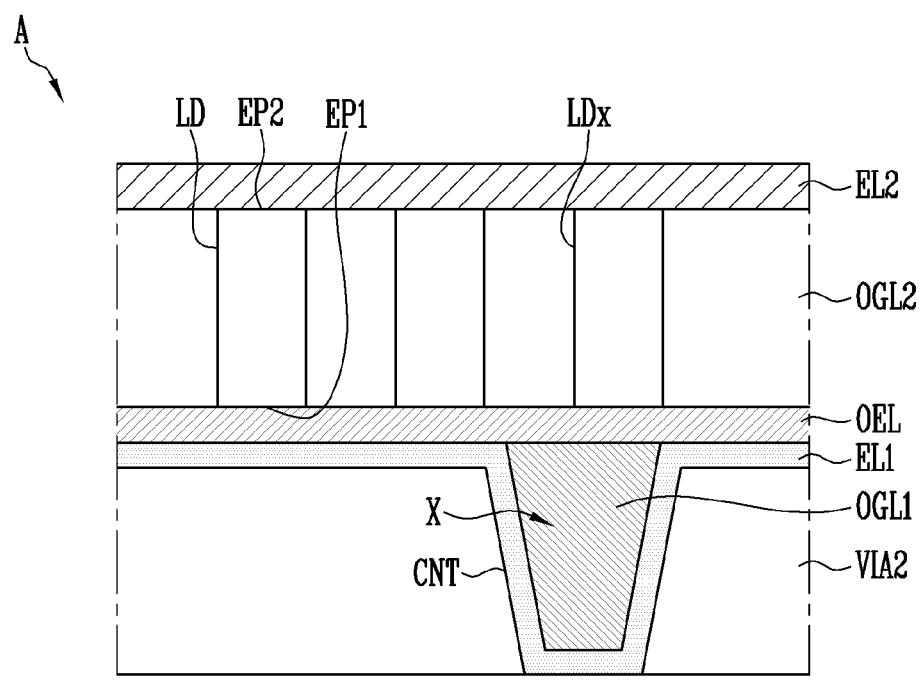
FIG. 14 is a schematic cross-sectional view illustrating a structure in which a light emitting element and a second electrode are disposed in the schematic cross-sectional view of FIG. 13.

FIGS. 12A through 12C are schematic plan views schematically illustrating components of a pixel included in the display device in accordance with an embodiment, FIG. 13 is a schematic cross-sectional view taken along line XII-XII' of FIG. 12C, and FIG. 14 is a schematic cross-sectional view illustrating a structure in which a light emitting element and a second electrode are disposed in the schematic cross-sectional view of FIG. 13.

Referring to FIGS. 12A through 12C to 14, the display element layer in accordance with an embodiment may include a first electrode EL1, a first organic layer OGL1, an overlapping electrode OEL, a light emitting element LD, a second organic layer OGL2, and a second electrode EL2. Since FIGS. 12A through 12C to 14 are similar to FIGS. 9A through 9C to 11, respectively, the following description will focus on differences.

The first organic layer OGL1 may be provided on the first electrode EL1 to be located or disposed on only the pixel contact hole region X. In other words, the first organic layer OGL1 may be located or disposed only within the pixel contact hole CNT to cover or overlap only the pixel contact hole CNT. Thus, the upper surface of the first organic layer OGL1 and the upper surface of the first electrode EL1 may be placed on a same line.

The overlapping electrode OEL may be provided on the first organic layer OGL1 and the first electrode EL1 to cover or overlap the first organic layer OGL1 and the first electrode EL1. Since the first organic layer OGL1 may be located or disposed only in the pixel contact hole region X, the overlapping electrode OEL may entirely overlap the first electrode EL1. The overlapping electrode OEL and the first electrode EL1 may be in contact with or direct contact with each other, thus having the same potential.

The overlapping electrode OEL may be located or disposed on the first electrode EL1 with the first organic layer OGL1 being filled in the pixel contact hole region X, thus having a flat upper surface.

Referring to FIG. 14, the light emitting element LDx disposed in the pixel contact hole region X may be disposed without being inclined by the flat overlapping electrode OEL. Thus, the display device in accordance with an embodiment may prevent contact failure between the light emitting element LDx and the first electrode EL1, which may occur in the pixel contact hole region X.

Hereinafter, the configuration of a display deice in accordance with a comparative example will be described with reference to FIGS. 15 to 16.

Figure 15:
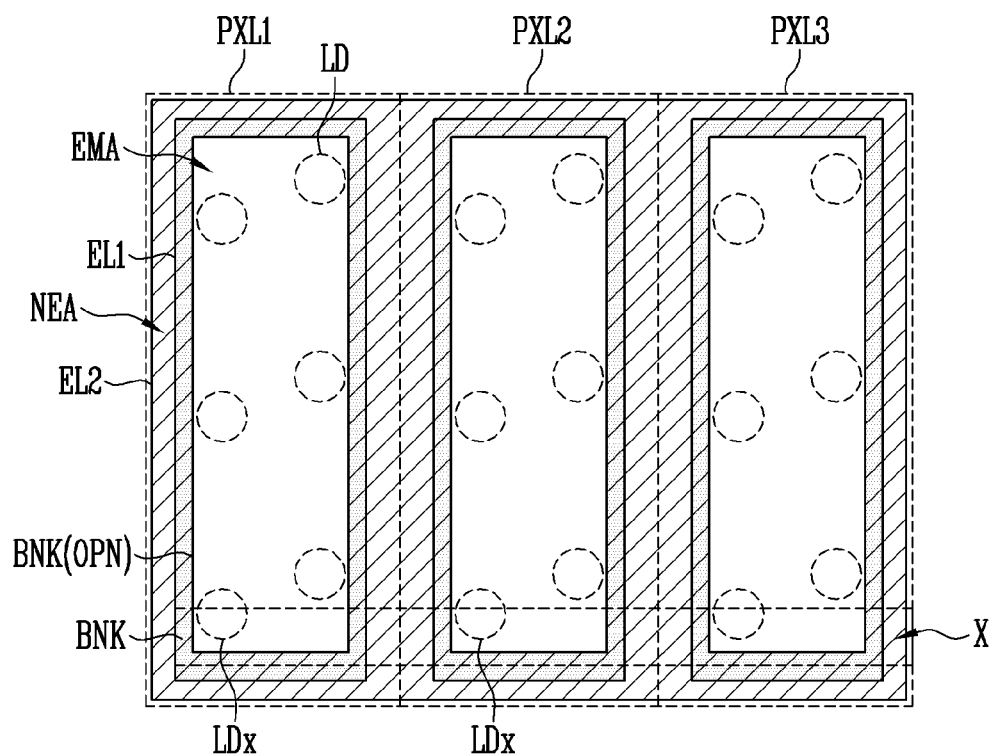
FIG. 15 is a schematic plan view schematically illustrating a display device in accordance with a comparative example.
Figure 16:
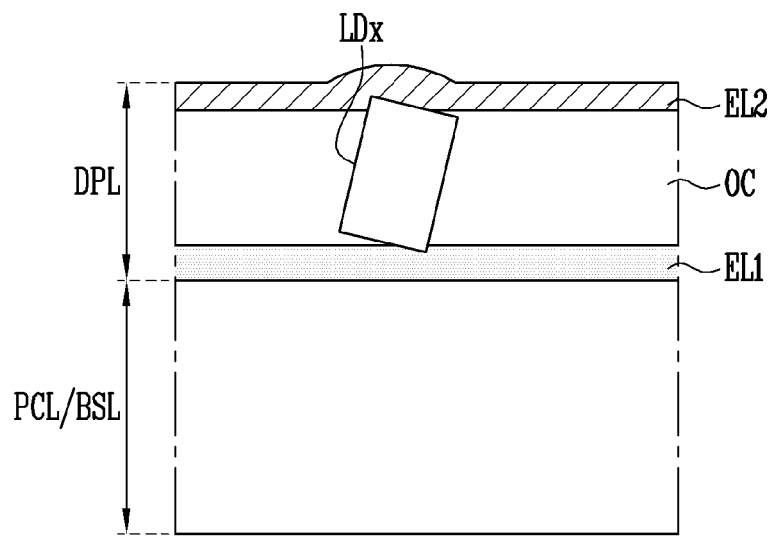
FIG. 16 is a schematic cross-sectional view schematically illustrating a position of a light emitting element included in a display device in accordance with a comparative example.

FIG. 15 is a schematic plan view schematically illustrating a display device in accordance with a comparative example, and FIG. 16 is a schematic cross-sectional view schematically illustrating a position of a light emitting element included in a display device in accordance with a comparative example.

Referring to FIG. 15, each of pixels PX1, PX2, and PX3 of the display device in accordance with the comparative example may include a first electrode EL1, a bank BNK, and a second electrode EL2.

The first electrode EL1 may be electrically connected or coupled to a first transistor T1 through a contact hole in a pixel contact hole region X.

The bank BNK may be located or disposed in a non-emission region NEA surrounding an emission region EMA. An opening OPN of the bank BNK may coincide with an edge of the emission region EMA.

Light emitting elements LD may be disposed in the emission region EMA. Among the light emitting elements LD, a light emitting element LDx disposed to overlap at least a portion of the pixel contact hole region X may be inclined by the pixel contact hole through which the first electrode EL1 and the first transistor may be connected or coupled.

FIG. 16 illustrates a base layer BSL, a pixel circuit layer PCL, and a light emitting element LDx, an organic layer OC, and a second electrode EL2 which are disposed over a first electrode EL1 of the display device in accordance with a comparative example.

The light emitting element LDx is disposed to at least partially overlap the pixel contact hole region X of FIG. 15, and may be inclined by the pixel contact hole through which the first electrode EL1 and the first transistor may be connected or coupled.

Thus, the second electrode EL2 covering or overlapping the light emitting element LDx and the organic layer OC may not be smoothly formed, and the light emitting element LDx may not be properly bonded to the first electrode EL1. In other words, the display device in accordance with a comparative example is problematic in that the light emitting element LDx inclined in the pixel contact hole region X may cause a poor electric connection of the first electrode EL1 and/or the second electrode EL2.

However, in the display device in accordance with an embodiment, it is possible to provide the flat electrode surface in the pixel contact hole region, by locating or disposing the first organic layer and the overlapping electrode on the first electrode. Thus, it is possible to prevent contact failure between the light emitting element and the anode or cathode, which may occur in the pixel contact hole region, by disposing the light emitting element located or disposed in the pixel contact hole region without being inclined.

Hereinafter, various embodiments to which a display device in accordance with an embodiment may be applied will be described with reference to FIGS. 17 to 20.

Figure 17:
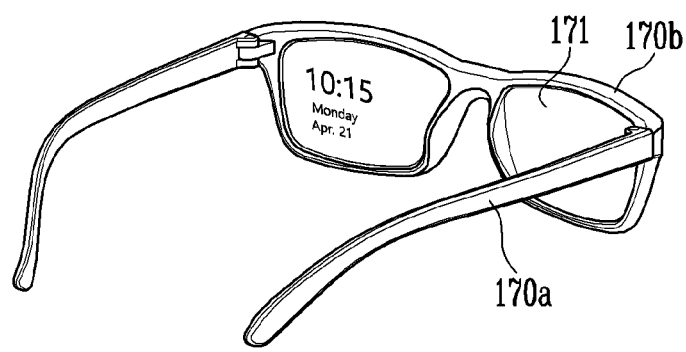
FIG. 17 is a diagram illustrating a display device applied to smart glasses in accordance with an embodiment.
Figure 18:
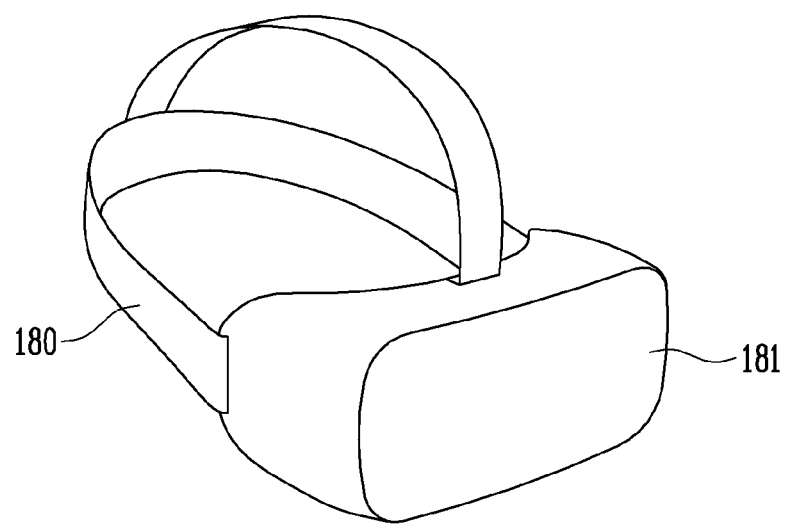
FIG. 18 is a diagram illustrating a display device applied to a head mounted display in accordance with an embodiment.
Figure 19:
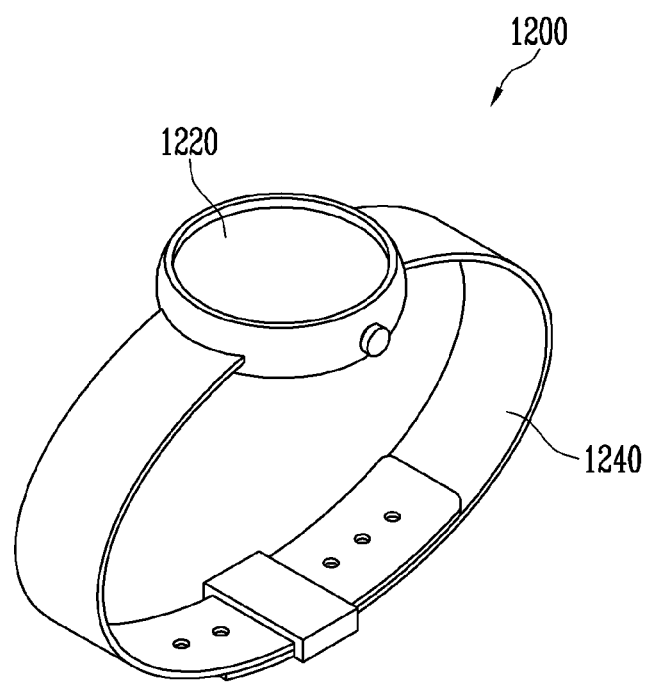
FIG. 19 is a diagram illustrating a display device applied to a smart watch in accordance with an embodiment.
Figure 20:
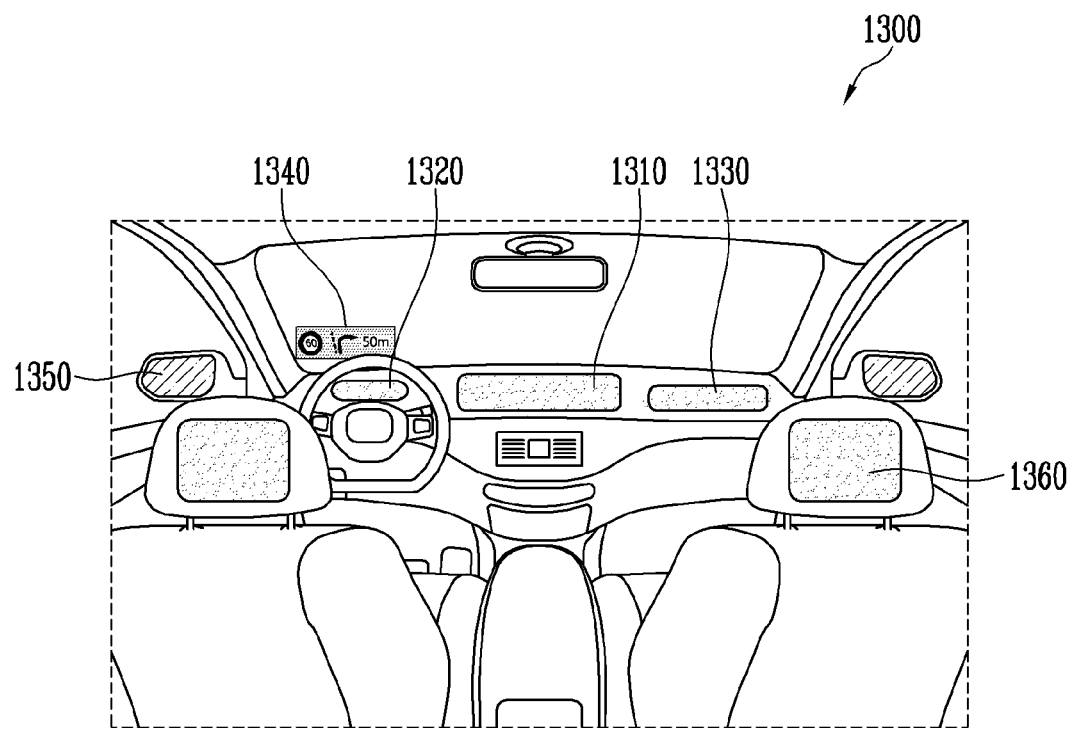
FIG. 20 is a diagram illustrating a display device applied to an automotive display in accordance with an embodiment.

FIG. 17 is a diagram illustrating a display device applied to smart glasses in accordance with an embodiment, FIG. 18 is a diagram illustrating a display device applied to a head mounted display in accordance with an embodiment, FIG. 19 is a diagram illustrating a display device applied to a smart watch in accordance with an embodiment, and FIG. 20 is a diagram illustrating a display device applied to an automotive display in accordance with an embodiment.

Referring to FIG. 17, a display device in accordance with an embodiment may be applied to smart glasses including a frame 170 and a lens part 171. The smart glasses are wearable electronic devices that may be worn on a user's face, and may have a structure in which a portion of the frame 170 is folded or unfolded. For example, the smart glasses may be a wearable device for augmented reality (AR).

The frame 170 may include a housing 170b that supports the lens part 171 and a leg part 170a that is used in case that a user wears the smart glasses. The leg part 170a may be connected to the housing 170b by a hinge to be folded or unfolded.

A battery, a touch pad, a microphone, a camera, and the like may be built in the frame 170. Further, a projector that outputs light, a processor that controls an optical signal, for example, may be built in the frame 170.

The lens part 171 may be an optical member that transmits light or reflects light. The lens part 171 may include glass, transparent synthetic resin, or the like within the spirit and the scope of the disclosure.

Further, the lens part 171 reflects an image, created by the optical signal transmitted from the projector of the frame 170, by a rear surface of the lens part 171 (for example, a surface in the direction facing the user's eyes) to allow the image to be recognized by the user's eyes. For example, as illustrated in the drawing, the user may recognize information such as time and date displayed on the lens part 171. In other words, the lens part 171 is a kind of display device, and the display device according to the above-described embodiment may be applied to the lens part 171.

Referring to FIG. 18, the display device in accordance with an embodiment may be applied to the head mounted display (HMD) including a head mounting band 180 and a display receiving case 181. The head mounted display is a wearable electronic device that may be worn on a user's head.

The head mounting band 180 is a part that is connected to the display receiving case 181 to fix the display receiving case 181. Although the drawing illustrates that the head mounting band 180 may surround the top and both sides of a user's head, the disclosure is not limited thereto. The head mounting band 180 serves to fix the head mounted display to the user's head, and may be formed in the form of an eyeglass frame or a helmet.

The display receiving case 181 may receive the display device, and may include at least one lens. At least one lens is a part that provides an image to a user. For example, the display device in accordance with an embodiment may be applied to a left-eye lens and a right-eye lens provided in the display receiving case 181.

Referring to FIG. 19, a display device in accordance with an embodiment may be applied to a smart watch 1200 including a display part 1220 and a strap part 1240.

The smart watch 1200 is a wearable electronic device, and may have a structure in which the strap part 1240 is mounted on a user's wrist. Here, the display device in accordance with an embodiment may be applied to the display part 1220, so image data including time information may be provided to the user.

Referring to FIG. 20, a display device in accordance with an embodiment may be applied to an automotive display 1300. Here, the automotive display 1300 refers to an electronic device that is provided inside of or outside of a vehicle to provide image data.

According to an example, the display device may be applied to at least any one of an infotainment panel 1310, a cluster 1320, a co-driver display 1330, a head-up display 1340, a side mirror display 1350, and a rear-seat display 1360, which are provided in the vehicle.

While various embodiments have been described above, those skilled in the art will appreciate that various modifications, additions, and/or substitutions are possible, without departing from the scope and spirit of the disclosure.

Therefore, embodiments disclosed in this specification are only for illustrative purposes rather than limiting the spirit and scope of the disclosure. The scope of the disclosure should be defined by the accompanying claims.

According to an embodiment, it is possible to provide a flat electrode surface in a pixel contact hole region, by locating or disposing a first organic layer and an overlapping electrode on an anode. Thus, it is possible to prevent contact failure between a light emitting element and an anode or cathode, which may occur in the pixel contact hole region, by disposing the light emitting element located or disposed in the pixel contact hole region without being inclined.

The effects of the disclosure are not limited by the foregoing, and other various effects are included herein.

What is claimed is:
1. A display device comprising:
a base layer;
a pixel circuit layer disposed on the base layer, the pixel circuit layer including:
a first transistor; and
an insulating layer overlapping the first transistor;

a first electrode disposed on the pixel circuit layer, the first electrode electrically connected to the first transistor via a contact hole of the insulating layer;

a cover layer disposed on the first electrode and at least partially filling a contact hole region within the contact hole, the cover layer overlapping at least a portion of the first electrode;

a light emitting element including a first end and a second end, the first end electrically connected to the first electrode;

a second electrode disposed on the light emitting element, the second electrode electrically connected to the second end of the light emitting element; and a third electrode disposed on the cover layer, the third electrode electrically contacting at least a portion of the first electrode, wherein the cover layer has a flat upper surface above the contact hole region so as to planarize an upper surface of the third electrode, an upper surface of the third electrode is substantially flat, the third electrode directly contacts the first electrode at plural sides of the cover layer, and the first end of the light emitting element is electrically connected to the first electrode via the third electrode.

2. The display device according to claim 1, wherein
the first end of the light emitting element is disposed on the third electrode, and
the first end of the light emitting element directly contacts the third electrode.

3. The display device according to claim 2, wherein
the third electrode and the first electrode have a same potential.

4. The display device according to claim 1, wherein the first electrode comprises a transparent conductive material.

5. The display device according to claim 1, wherein the third electrode comprises a metal or at least one of copper, gold, tin, and an alloy thereof.

6. The display device according to claim 1, wherein the third electrode electrically connects the first electrode and the first end of the light emitting element.

7. The display device according to claim 1, wherein the light emitting element comprises:
a first semiconductor layer;
an active layer disposed on a first surface of the first semiconductor layer; and
a second semiconductor layer disposed on a first surface of the active layer.

8. The display device according to claim 1, wherein the first end of the light emitting element disposed on the contact hole of the insulating layer directly contacts the third electrode.

* * * * *